United States Patent
Oya et al.

(10) Patent No.: US 9,287,378 B2
(45) Date of Patent: Mar. 15, 2016

(54) NITRIDE SEMICONDUCTOR LIGHT-EMITTING ELEMENT AND METHOD FOR FABRICATING THE SAME

(71) Applicant: Panasonic Corporation, Osaka (JP)

(72) Inventors: Mitsuaki Oya, Osaka (JP); Toshiya Yokogawa, Nara (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/320,648

(22) Filed: Jul. 1, 2014

(65) Prior Publication Data
US 2015/0021653 A1 Jan. 22, 2015

(30) Foreign Application Priority Data
Jul. 19, 2013 (JP) .................................. 2013-150072

(51) Int. Cl.
*H01L 29/47* (2006.01)
*H01L 33/00* (2010.01)
*H01L 33/40* (2010.01)
*H01L 33/32* (2010.01)

(52) U.S. Cl.
CPC .......... *H01L 29/475* (2013.01); *H01L 33/0066* (2013.01); *H01L 33/40* (2013.01); *H01L 33/32* (2013.01); *H01L 2933/0016* (2013.01)

(58) Field of Classification Search
CPC .......................... H01L 29/475; H01L 33/0066
See application file for complete search history.

(56) References Cited

U.S. PATENT DOCUMENTS

| 6,423,562 | B1 | 7/2002 | Nido et al. |
| 8,581,296 | B2 | 11/2013 | Adachi et al. |
| 2011/0073838 | A1* | 3/2011 | Khan et al. ...................... 257/13 |
| 2013/0126902 | A1* | 5/2013 | Isozaki et al. .................. 257/76 |

FOREIGN PATENT DOCUMENTS

| JP | 03-108779 | 5/1991 |
| JP | 2011-103400 | 5/2011 |

OTHER PUBLICATIONS

Hou, et al., Effects of oxygen thermal annealing treatment on formation of ohmic contacts to n-GaN, Dec. 11, 2012, Applied Physics Letters, 101, 242105, pp. 1-4.*

(Continued)

*Primary Examiner* — Matthew Reames
*Assistant Examiner* — Vincent Wall
(74) *Attorney, Agent, or Firm* — McDermott Will & Emery LLP

(57) ABSTRACT

Provided is a nitride semiconductor light-emitting element having a low contact resistance between an n-type nitride semiconductor layer and an n-side electrode. A portion of the n-type nitride semiconductor layer is removed by a plasma etching process using a gas containing halogen to expose a surface region of the n-type nitride semiconductor layer. Next, such an exposed surface region is further subjected to a plasma treatment using a gas containing oxygen. After that, the n-side electrode formed of aluminum is formed so as to be in contact with the surface region. In the surface region, a carrier concentration is decreased from the inside of the n-type nitride semiconductor layer toward the n-side electrode.

14 Claims, 25 Drawing Sheets

(56) References Cited

OTHER PUBLICATIONS

S.M. Sze "Physics of Semiconductor Devices, 2nd ed." John Wiley, NY, 1981, Chap.2.5.

M.G.Buehler "Peripheral and Diffused Layer Effects on Effects on Doping Profiles" IEEE Transactions on Electron Devices, vol. ED-19, Nov. 1972, pp. 1171-pp. 1178.

\* cited by examiner

NITRIDE SEMICONDUCTOR LIGHT-EMITTING ELEMENT AND METHOD FOR FABRICATING THE SAME

BACKGROUND

1. Technical Field

The present invention relates to a nitride semiconductor light-emitting element and a method for fabricating the same.

2. Description of the Related Art

Recently, a nitride semiconductor light-emitting element having a principal plane of an m-plane has been researched and developed actively to improve an illumination efficiency. This is because a nitride semiconductor light-emitting element having a principal plane of an m-plane is free from piezoelectric field, which decrease luminous efficiency. Hereinafter, a nitride semiconductor light-emitting element having a principal plane of an m-plane is referred to as "m-plane nitride semiconductor light-emitting element".

US Pre-Grant Patent Application Publication No. 2013/0126902 discloses an m-plane nitride semiconductor light-emitting element. As shown in FIG. 11, this m-plane nitride semiconductor light-emitting element comprises an n-side electrode 30, an n-type nitride semiconductor layer 21, an active layer 22, a p-type nitride semiconductor layer 23 and a p-side electrode 40. A voltage is applied between the n-side electrode 30 and the p-side electrode 40 to emit light from the active layer 22.

According to the paragraphs 0161-0166 of US Pre-Grant Patent Application Publication No. 2013/0126902, this m-plane nitride semiconductor light-emitting element is fabricated as below. First, the n-type nitride semiconductor layer 21, the active layer 22 and the p-type nitride semiconductor layer 23 are epitaxially grown in this order on a substrate 10.

Then, a portion of the n-type nitride semiconductor layer 21, the active layer 22 and the p-type nitride semiconductor layer 23 is removed by dry etching using a chlorine-based gas to expose the n-type nitride semiconductor layer 21. The p-side electrode 40 and the n-side electrode 30 are formed on the p-type nitride semiconductor layer 23 and the portion of the n-type nitride semiconductor layer 21 which has been exposed by dry etching, respectively.

SUMMARY

The present invention provides a method for fabricating a nitride semiconductor light-emitting element, the method comprising steps of:

(a) growing an n-type nitride semiconductor layer epitaxially on a substrate, wherein the n-type nitride semiconductor layer has a principal plane of an m-plane;

(b) growing an active layer epitaxially on the n-type nitride semiconductor layer grown in the step (a), wherein the active layer has a principal plane of an m-plane;

(c) growing a p-type nitride semiconductor layer epitaxially on the active layer grown in the step (b) to obtain a nitride semiconductor stacking structure, wherein the p-type nitride semiconductor layer has a principal plane of an m-plane;

(d) removing a portion of the p-type nitride semiconductor layer, a portion of the active layer and a portion of the n-type nitride semiconductor layer by a plasma etching process using a gas containing halogen to the extent to form a plasma-etched surface region exposed on the n-type nitride semiconductor layer;

(e) subjecting the plasma-etched surface region exposed in the step (d) to a plasma treatment using a gas containing oxygen; and (f) forming an n-side electrode formed of aluminum on the plasma-etched surface region which has been subjected to the plasma treatment using the gas containing oxygen in the step (e), and forming a p-side electrode electrically connected to the p-type nitride semiconductor layer, wherein the n-side electrode is in contact with the plasma-etched surface region.

The present invention provides a nitride semiconductor light-emitting element, comprising:

an n-side electrode;
a p-side electrode;
an n-type nitride semiconductor layer electrically connected to the n-side electrode;
a p-type nitride semiconductor layer electrically connected to the p-side electrode; and
an active layer interposed between the n-type nitride semiconductor layer and the p-type nitride semiconductor layer, wherein
the n-type nitride semiconductor layer, the active layer, and the p-type nitride semiconductor layer each constitutes a nitride semiconductor layer having a principal plane of an m-plane,
the n-side electrode is formed of aluminum,
the n-side electrode contains gallium,
the n-side electrode is in contact with an surface region of the n-type nitride semiconductor layer, and
the surface region has a carrier concentration which decreases from the inside of the n-type nitride semiconductor layer toward the n-side electrode.

The present invention provides a method for forming a nitride semiconductor structure comprising an n-type nitride semiconductor layer and a metal layer which is formed on the n-type nitride semiconductor layer, the method comprising the following steps (d) to (f):

(d) subjecting a surface of the n-type nitride semiconductor layer to a plasma treatment using a gas containing halogen; wherein the n-type nitride semiconductor layer has a principal plane of an m-plane, (e) subjecting the surface of the n-type nitride semiconductor layer to a plasma treatment using a gas containing oxygen after the step (d); and (f) forming the metal layer formed of aluminum on the surface of the n-type nitride semiconductor layer subjected to the plasma treatment using the gas containing oxygen in the step (e) to obtain the nitride semiconductor structure, wherein the metal layer is in contact with the surface of the n-type nitride semiconductor layer.

The present invention provides a nitride semiconductor structure comprising:

an n-type nitride semiconductor layer; and
a metal layer which is electrically connected to and is formed on the n-type nitride semiconductor layer, wherein
the n-type nitride semiconductor layer has a principal plane of an m-plane;
the metal layer is formed of aluminum;
the metal layer contains gallium;
the metal layer is in contact with the surface of the n-type nitride semiconductor layer; and
the surface of the n-type nitride semiconductor layer has a carrier concentration which decreases from the inside of the n-type nitride semiconductor layer toward the metal layer.

The present invention provides an m-plane nitride semiconductor light-emitting element having a low contact resistance between the n-type nitride semiconductor layer and the n-side electrode.

DETAILED DESCRIPTION OF THE EMBODIMENTS

Embodiments of the present invention will be described below with reference to the drawings.

First, a method for fabricating the nitride semiconductor light-emitting element shown in FIG. 1 according to the present embodiment is described with reference to FIG. 2A - FIG. 2G.

(Step (a))

Figure 2A:
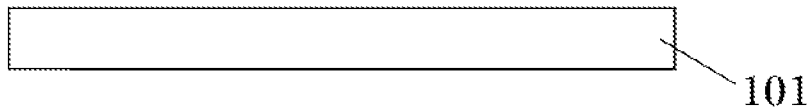
FIG. 2A shows one step included in the method for fabricating the nitride semiconductor light emitting element according to the embodiment.

As shown in FIG. 2A, a substrate 101 is prepared. An example of the substrate 101 is a sapphire substrate having a principal plane of an a-plane and a gallium nitride substrate having a principal plane of an m-plane. A gallium nitride single-crystalline substrate having a principal plane of an m-plane is desirable. Other substrates 101 such as an SiC substrate may be used, as long as the nitride semiconductor layer having a principal plane of an m-plane is epitaxially grown on the substrate 101.

Figure 8:
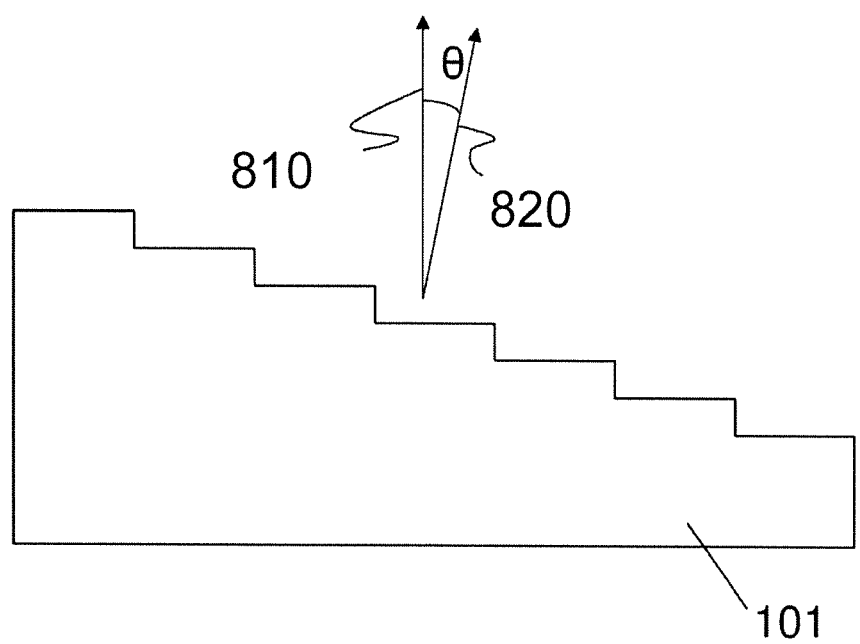
FIG. 8 shows a substrate having an off-angle θ.

As shown in FIG. 8, the substrate 101 may have an off-angle θ. The off-angle θ is formed between the normal direction 810 of the m-plane and the normal direction 820 of the principal plane. The off-angle θ may be more than 0 degrees and not more than 5 degrees. When the substrate 101 has an off-angle θ, the surface of the substrate 101 is stepwise microscopically. Desirably, the off-angle θ is 0 degrees. In other words, it is desirable that the substrate 101 does not have an off-angle θ.

Figure 2B:
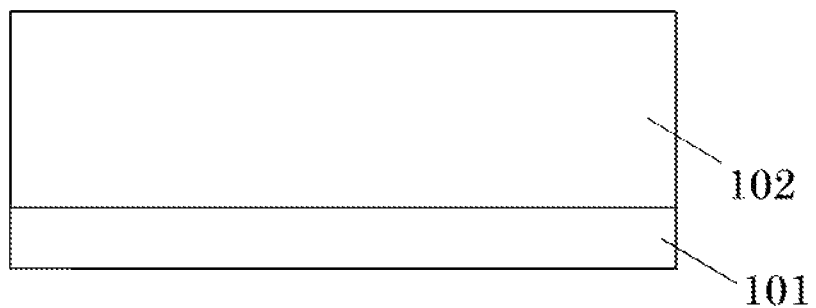
FIG. 2B shows one step subsequent to FIG. 2A included in the method for fabricating the nitride semiconductor light emitting element according to the embodiment.

Then, as shown in FIG. 2B, an n-type nitride semiconductor layer 102 having a principal plane of an m-plane is epitaxially grown on the substrate 101. An example of the n-type dopant contained in the n-type nitride semiconductor layer 102 is silicon.

The term "nitride semiconductor" used in the present specification is a compound represented by the chemical formula: $Al_xIn_yGa_zN$ ($0 \leq x < 1$, $0 \leq y < 1$, $0 < z \leq 1$, $x+y+z=1$).

(Step (b))

Figure 2C:
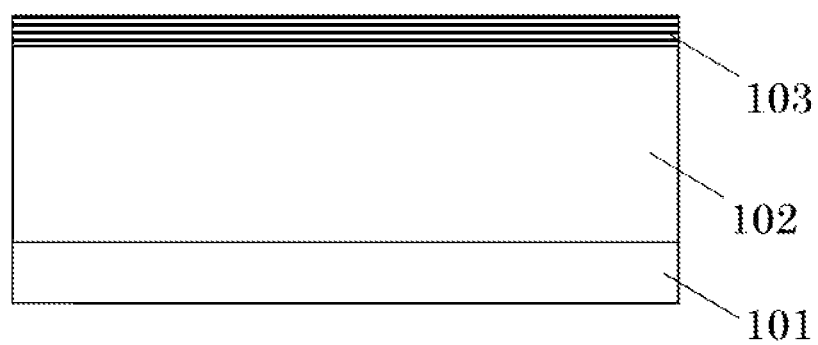
FIG. 2C shows one step subsequent to FIG. 2B included in the method for fabricating the nitride semiconductor light emitting element according to the embodiment.

As shown in FIG. 2C, an active layer 103 is epitaxially grown on the n-type nitride semiconductor layer 102. The active layer 103 also has a principal plane of an m-plane.

(Step (c))

Figure 2D:
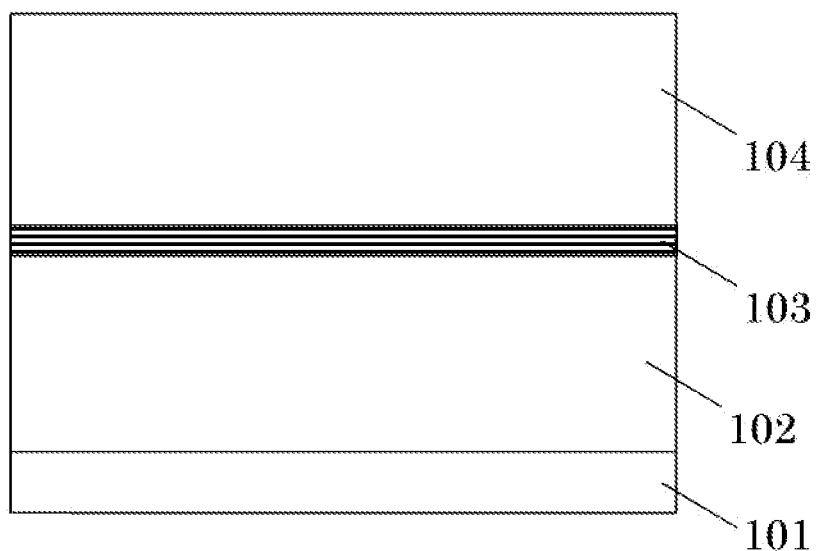
FIG. 2D shows one step subsequent to FIG. 2C included in the method for fabricating the nitride semiconductor light emitting element according to the embodiment.

As shown in FIG. 2D, a p-type nitride semiconductor layer 104 is epitaxially grown on the active layer 103. The p-type nitride semiconductor layer 104 also has a principal plane of an m-plane. An example of the p-type dopant contained in the p-type nitride semiconductor layer 104 is magnesium. In this way, obtained is a nitride semiconductor stacking structure composed of the n-type nitride semiconductor layer 102, the active layer 103 and the p-type nitride semiconductor layer 104.

(Step (d))

Figure 2E:
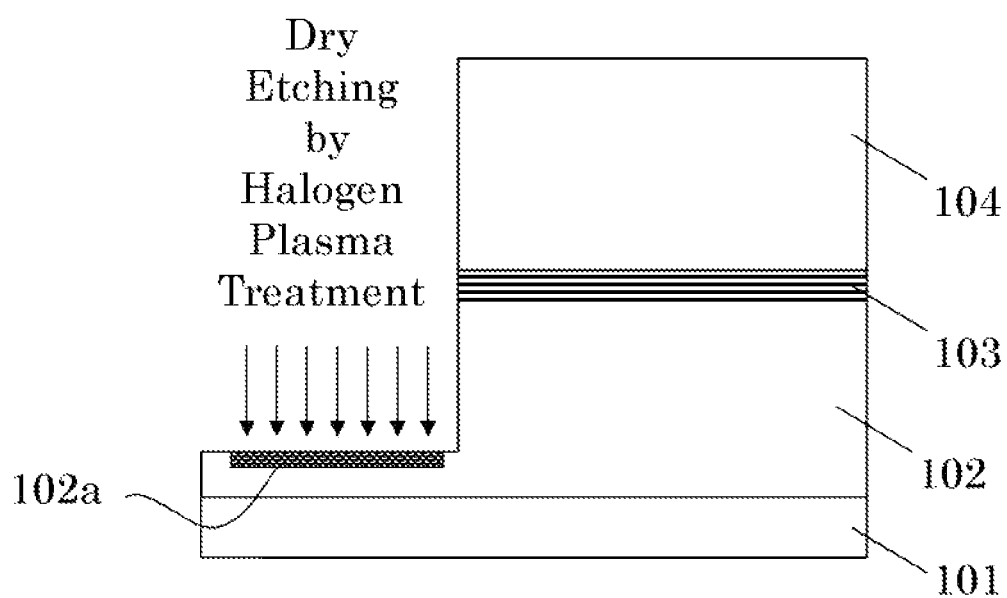
FIG. 2E shows one step subsequent to FIG. 2D included in the method for fabricating the nitride semiconductor light emitting element according to the embodiment.

Then, as shown in FIG. 2E, a portion of the n-type nitride semiconductor layer 102, the active layer 103 and the p-type nitride semiconductor layer 104 is removed by a plasma etching process using a gas containing halogen. In other words, the portion is dry-etched by the plasma etching process using the gas containing halogen. Thus, a surface region 102a of the n-type nitride semiconductor layer 102 is exposed. Since this surface region 102a has been subjected to the plasma etching process using the gas containing halogen, the surface region 102a contains halogen.

An example of halogen is fluorine, chlorine, bromine or iodine. Chlorine is desirable. An example of the gas containing chlorine is a chlorine gas, a hydrogen chloride gas, a carbon tetrachloride gas, a fluorine chloride gas, a germanium gas tetrachloride, a boron trichloride gas or mixture thereof. A chlorine gas is desirable. Therefore, it is desirable that the surface region 102a contains chlorine.

The term "halogen plasma treatment" used in the present specification means a plasma etching process using a gas containing halogen.

(Step (e))

Figure 2F:
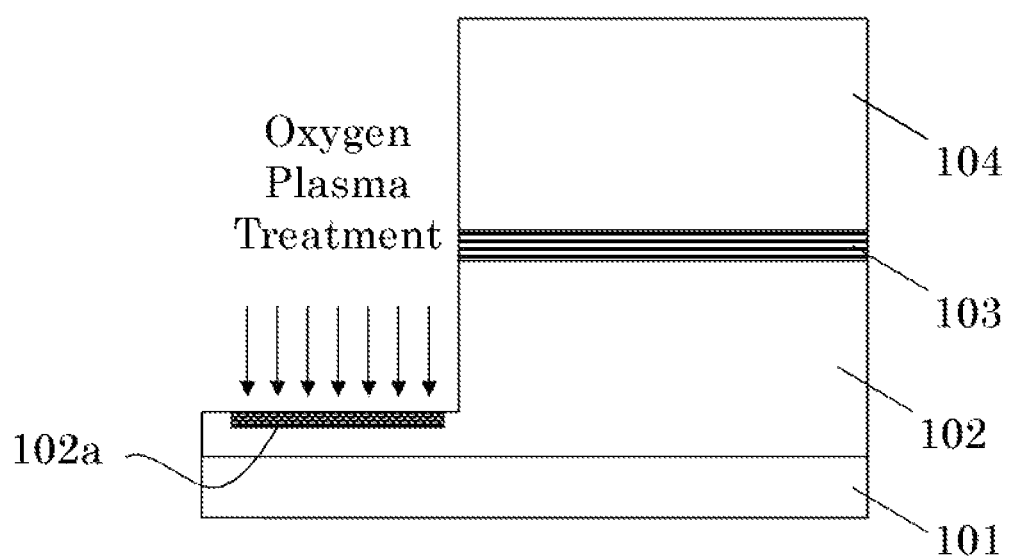
FIG. 2F shows one step subsequent to FIG. 2E included in the method for fabricating the nitride semiconductor light emitting element according to the embodiment.

As shown in FIG. 2F, the thus-exposed surface region 102a is further subjected to a plasma treatment using a gas containing oxygen. The plasma treatment using the gas containing oxygen is one of the characteristics of the present invention.

The term "oxygen plasma treatment" used in the present specification means a plasma treatment using a gas containing oxygen.

An example of oxygen is oxygen molecules or ozone molecules. Oxygen molecules are desirable. An example of the gas containing oxygen is an oxygen gas, an ozone gas or mixture thereof. An oxygen gas is desirable.

As understood from the example 1, the comparative example 1 - the comparative example 3, the reference example A1 - the reference example B2, and the reference comparative example A1- the reference comparative example B6, described below with Tables 5 and 6, the method of the present invention has the following three requirements (A)-(C):

(Requirement A): the n-side electrode 109 (see, FIG. 2G) which is in contact with the surface region 102a is formed of aluminum. Desirably, the n-side electrode 109 which is in contact with the surface region 102a consists only of aluminum.

(Requirement B): the n-type nitride semiconductor layer 102 has a principal plane of an m-plane.

(Requirement C): the surface region 102a which has been subjected to the plasma etching process by the halogen plasma treatment is further subjected to the oxygen plasma treatment.

Figure 6:
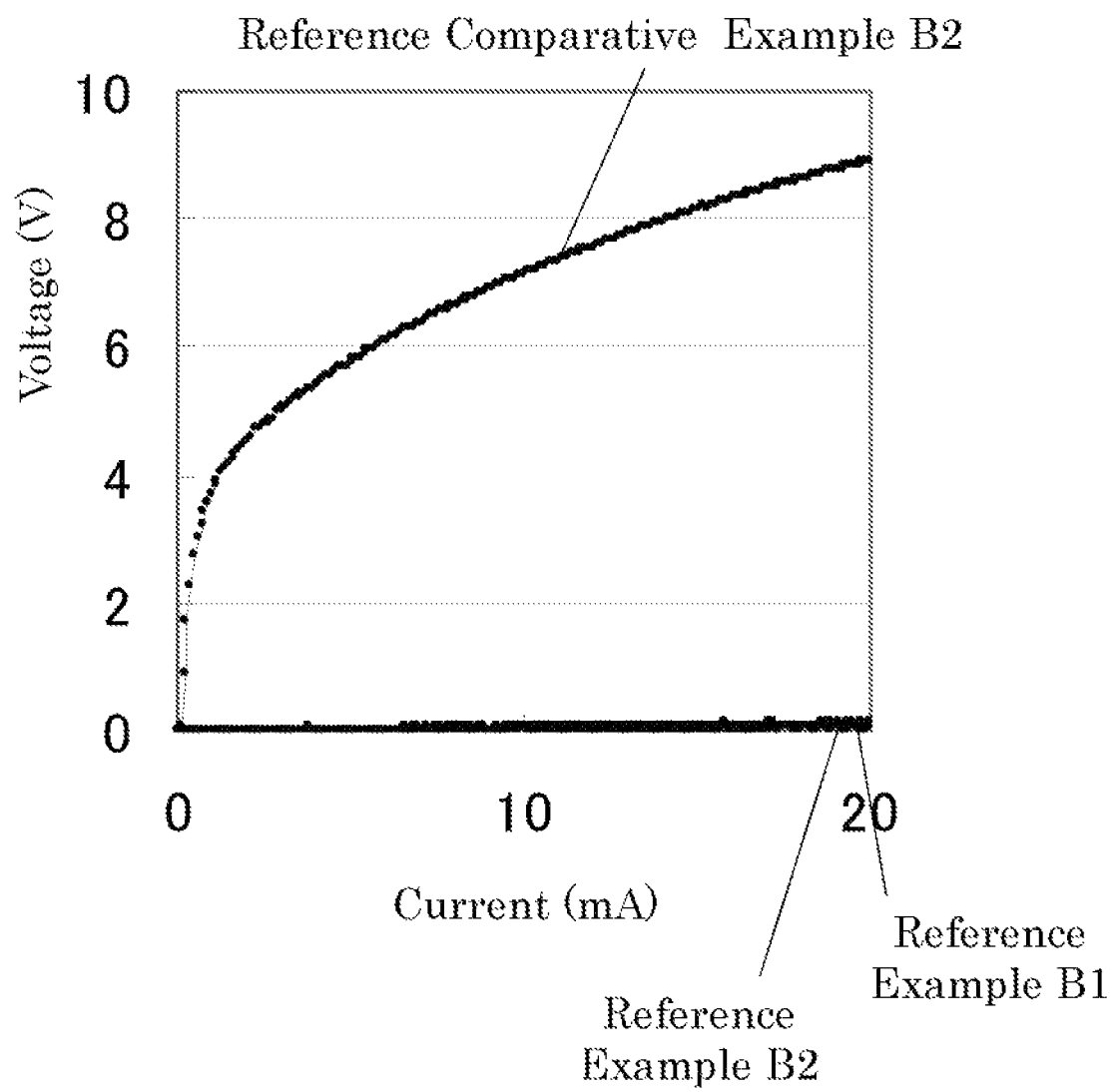
FIG. 6 shows current-voltage properties of the reference example B1, the reference example B2, and the reference comparative example B1.
Figure 7A:
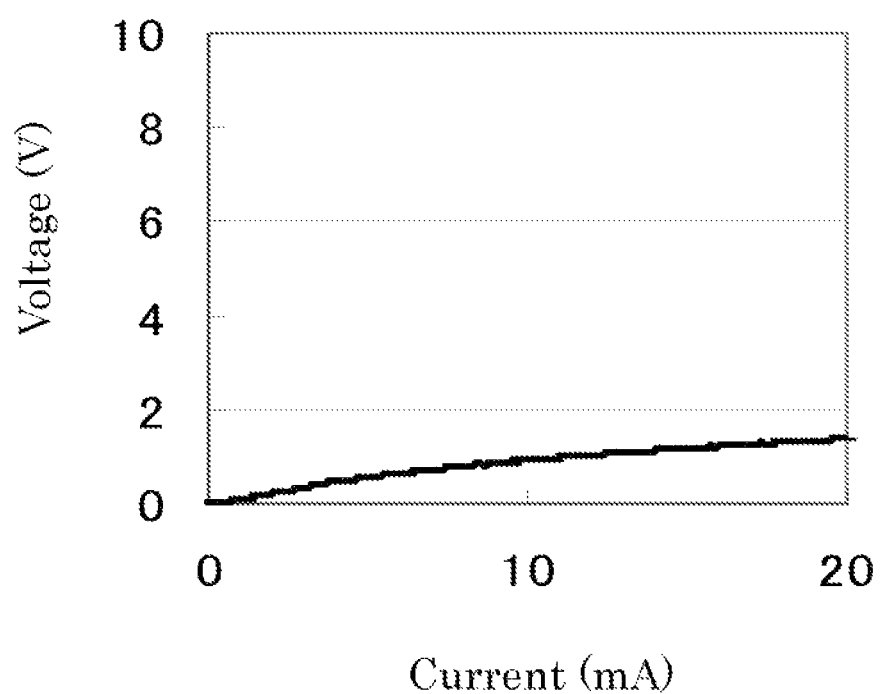
FIG. 7A shows current-voltage properties of the reference comparative example B2.
Figure 7B:
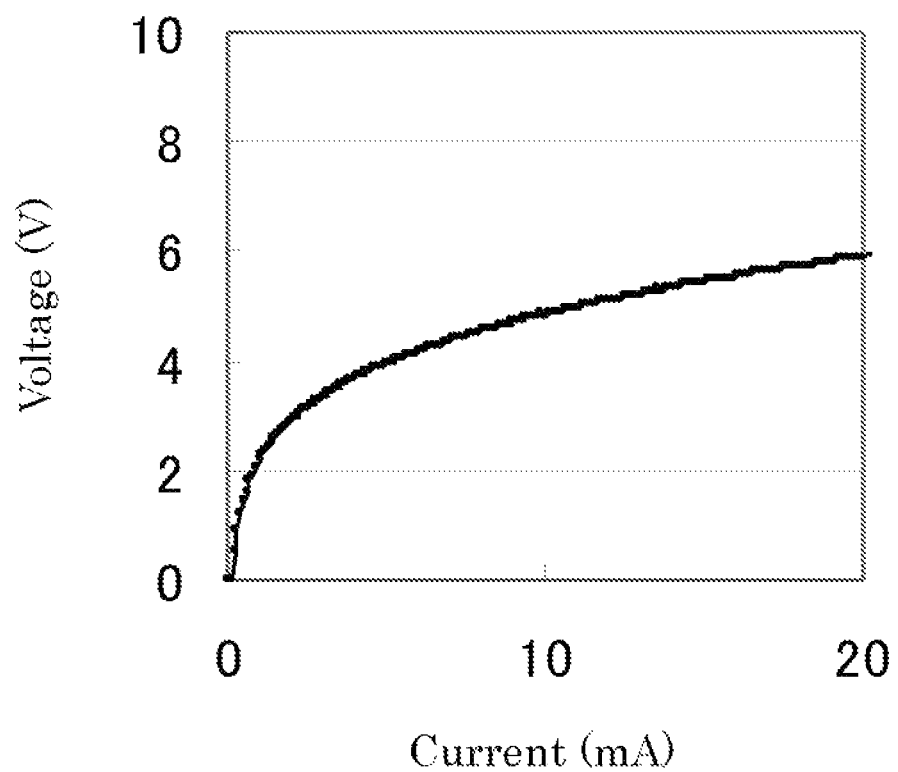
FIG. 7B shows current-voltage properties of the reference comparative example B3.
Figure 7C:
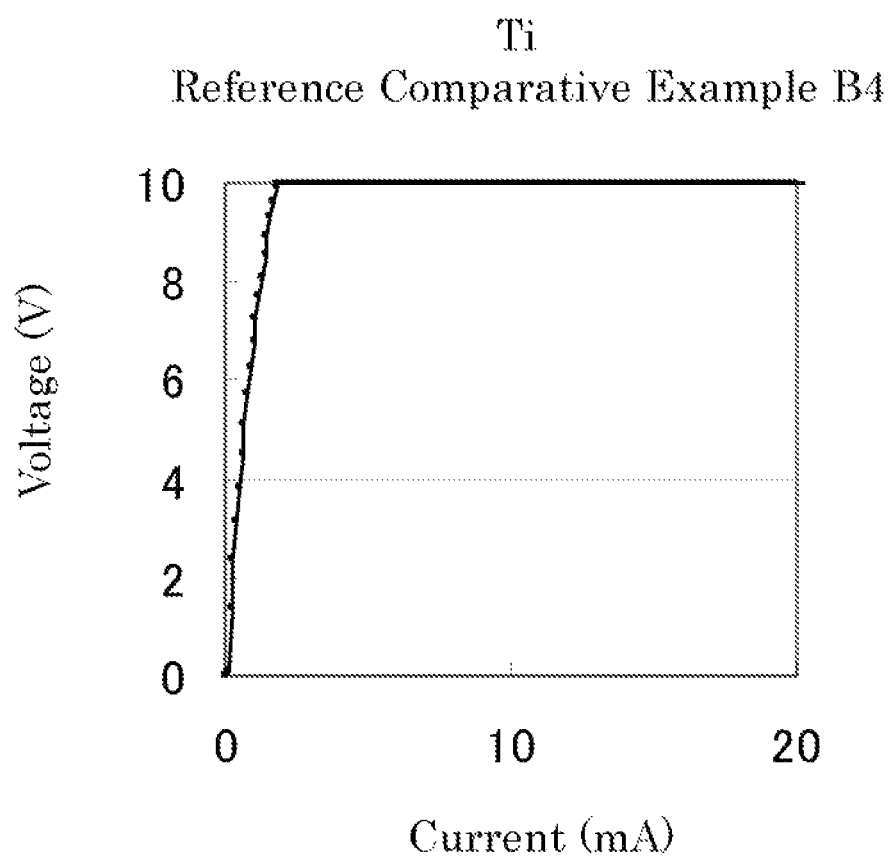
FIG. 7C shows current-voltage properties of the reference comparative example B4.
Figure 7D:
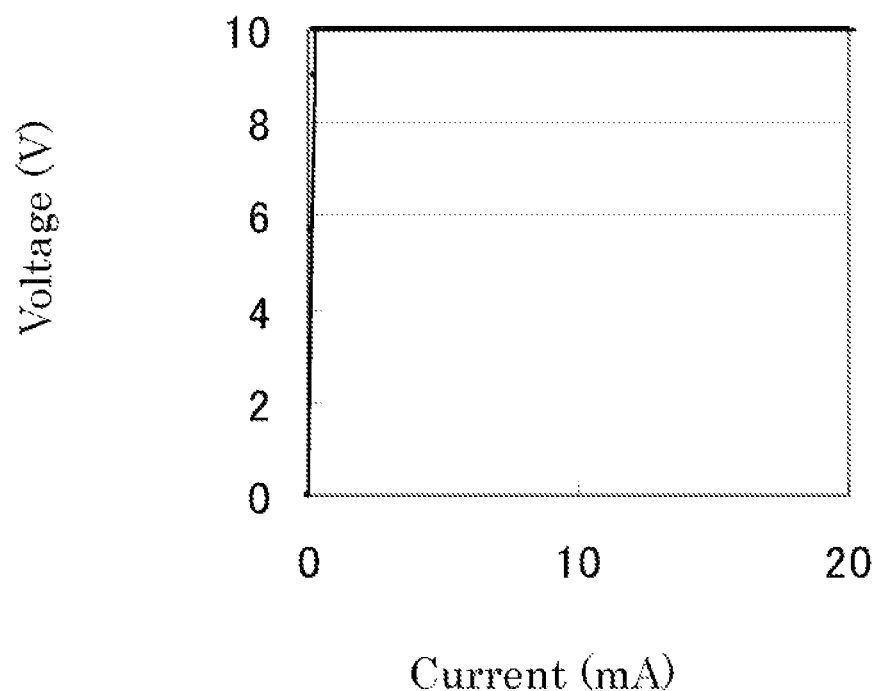
FIG. 7D shows current-voltage properties of the reference comparative example B5.
Figure 7E:
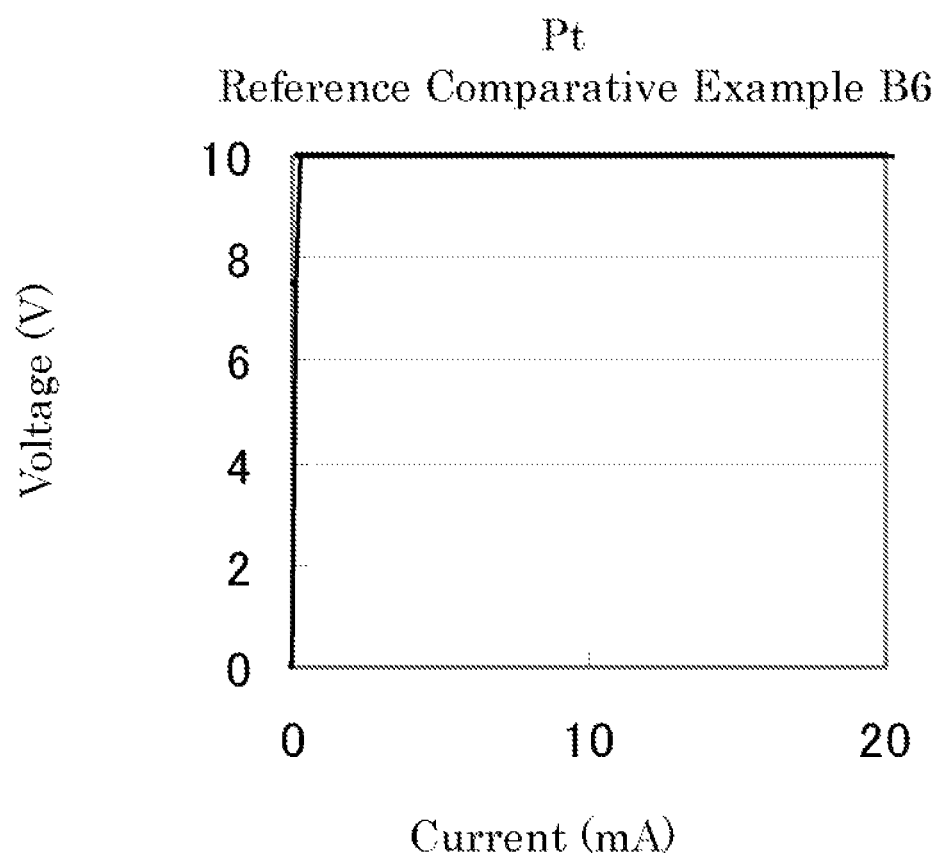
FIG. 7E shows current-voltage properties of the reference comparative example B6.

In case where the requirement (A) is not satisfied, the contact resistance between the n-side electrode 109 and the n-type nitride semiconductor is high, as understood from the reference comparative examples B2 - B6 (see, Table 6 and FIGS. 6-7E). For example, when a titanium layer is in contact with the n-type nitride semiconductor layer, the contact resistance is high.

In case where the requirement (B) is not satisfied, the surface region 102a which has been subjected to the oxygen plasma treatment has a higher contact resistance than the surface region 102a which has not yet subjected to the oxygen plasma treatment. For example, as understood from the comparative examples 2- 3, when the surface region 102a has a principal plane of a c-plane, the oxygen plasma treatment increases the contact resistance.

In case where the requirement (C) is not satisfied, as understood from the comparative example 1, the contact resistance of the surface region 102a is not lowered.

In this way, the requirements (A)-(C) are indivisible.

As understood from the example 1, the comparative example 1-the comparative example 3, the reference example A1-the reference example B2, and the reference comparative example A1-the reference comparative example B6, described below with Tables 5 and 6, the method of the present invention has the following three requirements (A)-(C):

(Requirement A): the n-side electrode 109 which is in contact with the surface region 102a is formed of aluminum. Desirably, the n-side electrode 109 which is in contact with the surface region 102a consists only of aluminum.

(Requirement B): the n-type nitride semiconductor layer 102 has a principal plane of an m-plane.

(Requirement C): the surface region 102a which has been subjected to the plasma etching process by the halogen plasma treatment is further subjected to the oxygen plasma treatment.

In case where the requirement (A) is not satisfied, the contact resistance between the n-side electrode 109 and the n-type nitride semiconductor is high, as understood from the reference comparative examples B2 -B6 (see, Table 6 and FIGS. 6-7E). For example, when a titanium layer is in contact with the n-type nitride semiconductor layer, the contact resistance is high.

(Step (e1))

After the oxygen plasma treatment, it is desirable that the surface region 102 is subjected to an acid treatment. In this way, it is desirable to remove the outermost surface of the surface region 102a. The acid treatment further lowers the contact resistance.

In particular, it is desirable that the surface region 102a is subjected to an acid treatment using buffered hydrofluoric acid.

(Step (f))

Figure 2G:
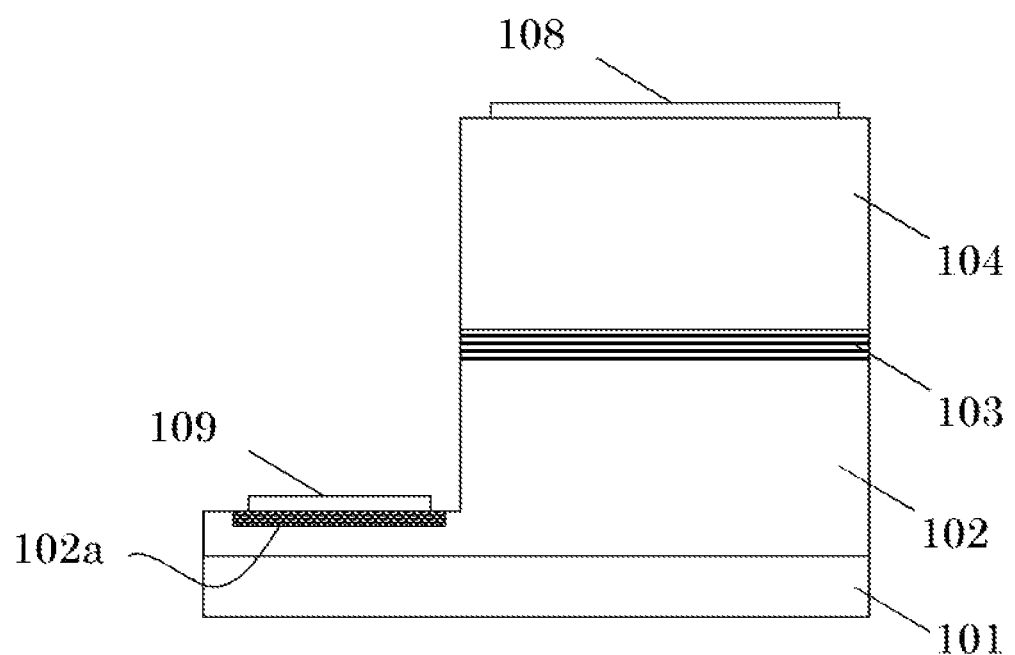
FIG. 2G shows one step subsequent to FIG. 2F included in the method for fabricating the nitride semiconductor light emitting element according to the embodiment.

As shown in FIG. 2G, the n-side electrode 109 is formed on the thus-formed surface region 102a. The p-side electrode 108 is formed on the p-type nitride semiconductor layer 104.

The n-side electrode 109 is formed of aluminum. In other words, the main component of the n-side electrode 109 is aluminum. In one embodiment, the n-side electrode 109 may be one metal layer formed of aluminum. The n-side electrode 109 is in contact with the surface region 102a. The n-side electrode 109 may consist only of aluminum.

The n-side electrode 109 may be a laminate in which plural metal layers are stacked. In this case, the metal layer in contact with the surface region 102a, namely, the bottom metal layer, is formed of aluminum. In this way, it is desirable that the n-side electrode 109 has a shape of a layer parallel to the n-type nitride semiconductor layer 102.

(Step (g))

After the step (f), it is desirable that the obtained nitride semiconductor stacking structure is subjected to a sinter treatment under a temperature of not less than 400 degrees Celsius and not more than 600 degrees Celsius to activate the p-type dopant, such as magnesium, and the n-type dopant, such as silicon.

During the sinter treatment of the nitride semiconductor stacking structure, gallium atoms are diffused from the n-type nitride semiconductor layer 102 into the n-side electrode 109, as understood from the secondary ion mass spectrometry of the examples 1-2 and the comparative example, which are described later. See FIG. 9 and FIG. 10. This diffusion phenomenon occurs between the surface region 102a and the n-side electrode 109. Therefore, after the sinter treatment, the n-side electrode 109 contains not only aluminum but also gallium. Similarly, n-type impurities, namely, silicon, may also be diffused from the n-type nitride semiconductor layer 102. Therefore, the n-side electrode 109 may further contain silicon.

Desirably, the sinter treatment is performed after an aluminum layer consisting only of aluminum is formed on the surface region 102a. After the sinter treatment, the n-side electrode 109 is formed of aluminum and contains gallium. In other words, the n-side electrode 109 has a main component of aluminum and contains a small amount of gallium. As described above, it is desirable that the n-side electrode 109 also contains a small amount of silicon.

When the n-side electrode 109 is the laminate in which the plural metal layers are stacked, a metal component contained in another metal layer formed on the bottom metal layer of aluminum may be diffused into the bottom metal layer of aluminum due to the sinter treatment. Accordingly, in this case, the bottom metal layer of the n-side electrode 109 may be formed of aluminum and may contain gallium and another metal after the sinter treatment. In other words, the bottom metal layer of the n-side electrode 109 may have a main component of aluminum and may contain a small amount of gallium and another metal.

Figure 1:
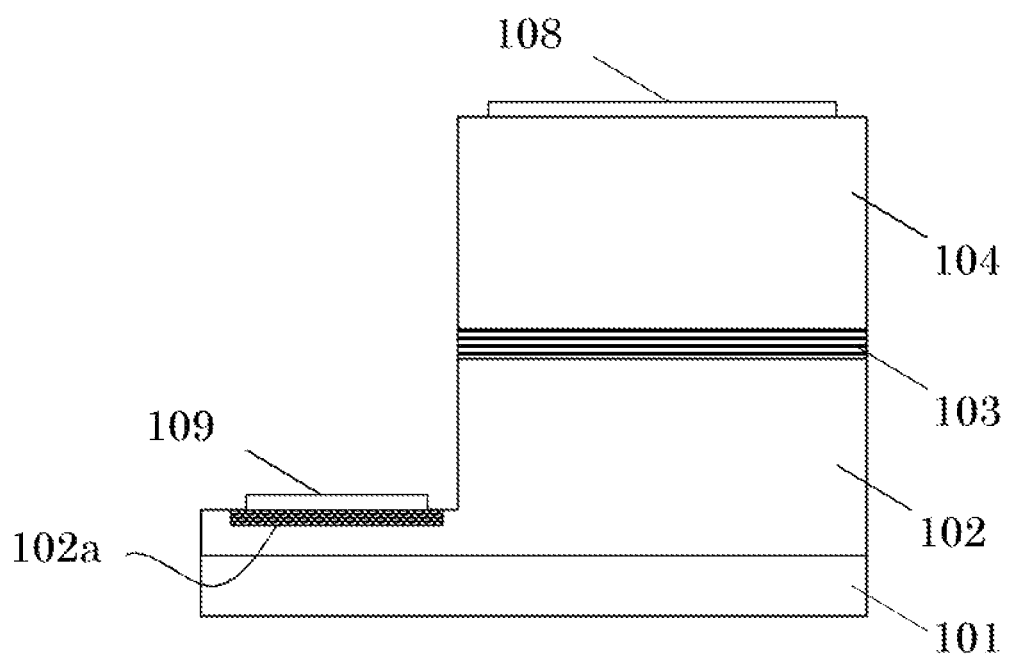
FIG. 1 shows a cross-sectional view of the nitride semiconductor light emitting element according to the embodiment.

In this way, the nitride semiconductor light-emitting element shown in FIG. 1 is obtained.

Next, the nitride semiconductor light-emitting element shown in FIG. 1 is described.

As described above, similarly to a conventional m-plane nitride semiconductor light-emitting element, the nitride semiconductor light-emitting element according to the present embodiment comprises the n-side electrode 109, the p-side electrode 108, the n-type nitride semiconductor layer 102, the p-side nitride semiconductor 106 and the active layer 103. The n-type nitride semiconductor layer 102 and the p-type nitride semiconductor layer 104 are electrically connected to the n-side electrode 109 and the p-side electrode 108, respectively. The active layer 103 is interposed between the n-type nitride semiconductor layer 102 and the p-type nitride semiconductor layer 104. The n-type nitride semiconductor layer 102, the active layer 103 and the p-type nitride semiconductor layer 104 each has a principal plane of an m-plane.

The n-side electrode 109 is formed of aluminum and contains gallium. In other words, the n-side electrode 109 has a main component of aluminum and contains small amount of gallium. The n-side electrode 109 may contain silicon. The n-side electrode 109 may contain a small amount of metal other than aluminum and gallium.

As demonstrated in the reference examples A1-A2, and the reference comparative example A1 (in particular, see Table 5), the surface region 102a has a carrier concentration which decreases from the inside of the n-type nitride semiconductor layer 102 toward the n-side electrode 109 after the oxygen plasma treatment. Desirably, the carrier concentration is monotonically decreased from the inside of the n-type nitride semiconductor layer 102 toward the n-side electrode 109. In case where the oxygen plasma treatment is not performed, the carrier concentration is constant.

(Theoretical Explanation)

The theory of the present invention is described below. However, the present inventors do not like to be bound by the following theories.

Figure 3A:
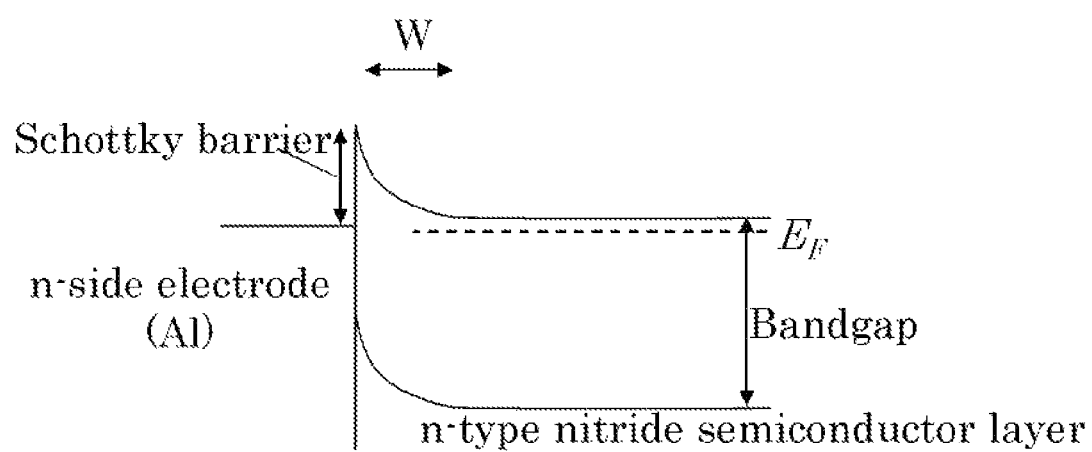
FIG. 3A shows a bandgap between the n-side electrode formed of aluminum and the n-type nitride semiconductor layer.

FIG. 3A shows a bandgap between the n-side electrode formed of aluminum and the n-type nitride semiconductor layer. As shown in FIG. 3A, a Schottky barrier having a width W is formed between the n-side electrode formed of aluminum and the n-type nitride semiconductor layer.

Generally, N vacancies are formed in the n-type n-side nitride semiconductor layer to lower the contact resistance between the n-side electrode and the n-type nitride semiconductor layer. See the paragraph 0013 of US-PreGrant Patent Application Publication No 2011/0108853.

Figure 3B:
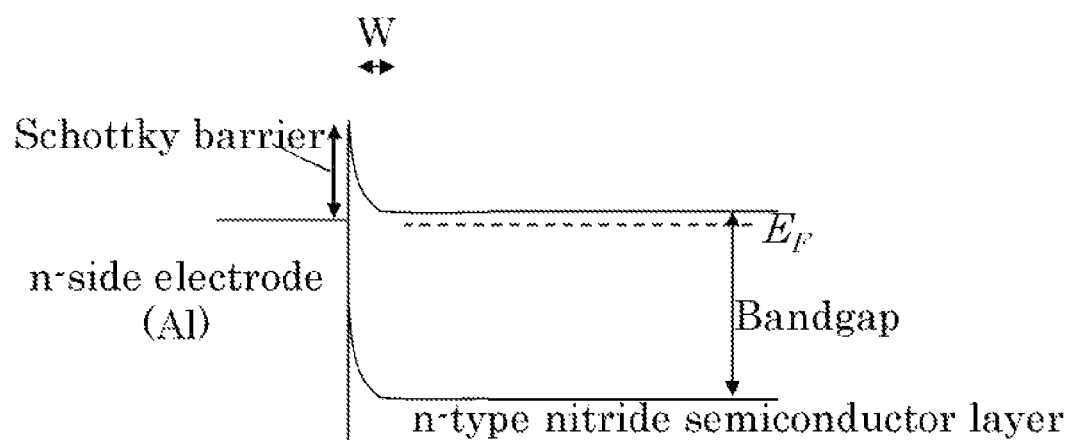
FIG. 3B shows a bandgap in a case where N vacancies are formed in the n-type nitride semiconductor layer.

FIG. 3B shows a bandgap in a case where N vacancies are formed in the n-type nitride semiconductor layer. As readily understood from the comparison to FIG. 3A, N vacancies narrow the width W of the Schottky barrier. For this reason, compared to the case of FIG. 3A, electrons supplied from the n-side electrode overcome the Schottky barrier more easily.

However, as is clear from the secondary ion mass spectrometry of the examples 1-2 and the comparative example 1, which are described later, the Ga vacancies are formed in the surface region 102a in the present embodiment. See FIG. 9 and FIG. 10. The Ga vacancies are formed in the surface region 102a due to the oxygen plasma treatment. Accordingly, the formation of the N vacancies does not contribute evidence to support the technical effect of the decrease of the contact resistance obtained in the present embodiment.

Figure 3C:
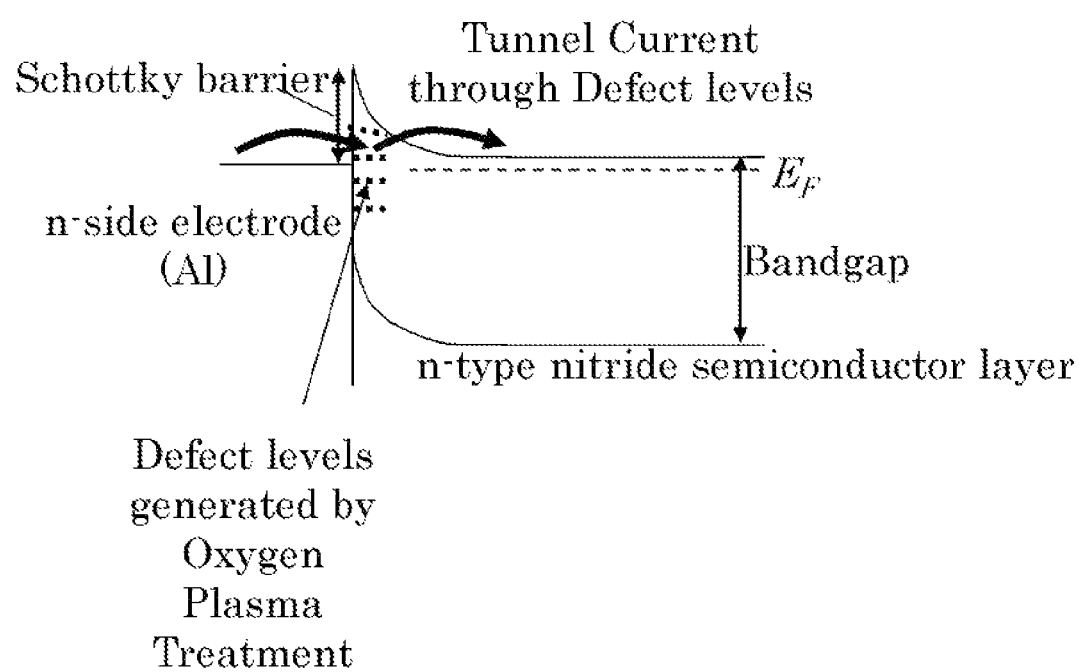
FIG. 3C shows a bandgap according to the embodiment.

FIG. 3C shows a bandgap according to the present embodiment. Defect levels are generated in the Schottky barrier due to the oxygen plasma treatment in the present embodiment. The electrons supplied from the n-side electrode flow through these defect levels to the n-type semiconductor layer. In other words, tunnel current flows from the n-side electrode through these defect levels to the n-type nitride semiconductor layer. The present inventors believe that the reason why the oxygen plasma treatment decreases the carrier concentration in the surface region 102a would be that some of carriers are bound by the defect levels generated by the oxygen plasma treatment. In other words, the oxygen plasma treatment would inactivate some of donors.

EXAMPLES

The present invention is described in greater detail with reference to the following examples.

A metalorganic chemical vapor deposition method (hereinafter, referred to as "MOCVD method") was used as an epitaxial growth method in the following examples and comparative examples.

The raw materials shown in the following Table 1 were used in the examples and comparative examples.

TABLE 1

| Al raw material | Trimethyl aluminum (TMA) |
| In raw material | Trimethyl indium (TMI) |
| Ga raw material | Trimethyl gallium (TMG) |
| Nitrogen raw material | Ammonia |
| n-type impurities | Monosilane |
| p-side impurities | Bis(cyclopentadienyl) magnesium ($Cp_2Mg$) |

Example 1

The example 1 is described with reference to FIG. 2A-FIG. 2G. First, as shown in FIG. 2A, the n-type GaN substrate 101 having a principal plane of an m-plane was prepared.

Then, as shown in FIG. 2B, the n-type GaN layer having a thickness of 1 micrometer was epitaxially grown at a growth temperature of 945 degrees Celsius on the n-type GaN substrate 101. The n-type GaN layer had a silicon concentration of $2.0 \times 10^{18}$ $cm^{-3}$. In this way, the n-type nitride semiconductor layer 102 was formed.

As shown in FIG. 2C, the active layer 103 was epitaxially grown at a growth temperature of 720 degrees Celsius on the n-type GaN layer. In greater detail, the active layer 103 was formed by stacking three $In_xGa_{1-x}N$ layers (x=0.16) each having a thickness of 6 nanometers and three GaN layers each having a thickness of 12 nanometers alternately.

Subsequently, an undoped GaN layer (not shown) having a thickness of 75 nanometers was epitaxially grown on the active layer 103.

Then, the p-type $Al_{x1}In_{y1}Ga_{z1}N$ layer (x=0.10, y=0, z=0.90) was epitaxially grown at a growth temperature of 890 degrees Celsius on the undoped GaN layer. The p-type $Al_{x1}In_{y1}Ga_{z1}N$ layer had a thickness of 20 nanometers. The p-type $Al_{x1}In_{y1}Ga_{z1}N$ layer had a magnesium concentration of approximately $5.0 \times 10^{18}$ $cm^{-3}$-$1.0 \times 10^{19}$ $cm^{-3}$. This p-type $Al_{x1}In_{y1}Ga_{z1}N$ layer (x=0.10, y=0, z=0.90) functioned as an overflow-suppression layer. In greater detail, excess electrons supplied from the n-side electrode 109 to the active layer 103 were blocked by the p-type $Al_{x1}In_{y1}Ga_{z1}N$ layer to return to the active layer 103.

Furthermore, the p-type GaN layer having a thickness of 85 nanometers was epitaxially grown at a growth temperature of 890 degrees Celsius on the p-type $Al_{x1}In_{y1}Ga_{z1}N$ layer. In this way, as shown in FIG. 2D, the p-type nitride semiconductor layer 104 was formed.

Then, as shown in FIG. 2E, a portion of the nitride semiconductor stacking structure shown in FIG. 2D was dry-etched by a halogen plasma treatment. In this way, a portion of the p-type nitride semiconductor layer 104, the active layer 103 and the n-type nitride semiconductor layer was removed to expose the surface region 102a on the surface of the n-type nitride semiconductor layer 102. Needless to say, this surface region 102a had been was subjected to the halogen plasma treatment.

Table 2 shows the condition of the dry-etching by the halogen plasma treatment.

TABLE 2

| Device | Product of ULVAC, Inc. Product number: NE701 |
|---|---|
| Plasma | ICP plasma |
| ICP power | 320 W |
| Bias | 30 W |
| Gas | Chlorine |
| Flow rate | 50 sccm |
| Pressure | 0.5 Pa |
| Time | 30 seconds |

After the dry-etching by the halogen plasma treatment, an $SiO_2$ protective film and a photoresist film (both of which are not shown) were formed on the nitride semiconductor stacking structure. The surface region 102a was not covered with the $SiO_2$ protective film and the photoresist film.

Then, as shown in FIG. 2F, the surface region 102a was subjected to an oxygen plasma treatment.

Table 3 shows the condition of the oxygen plasma treatment.

TABLE 3

| Device | Product of SAMCO Inc. Product number: RIE-10NR |
|---|---|
| Plasma | Parallel plate plasma |
| Power | 40 W |
| Gas | Oxygen |
| Flow rate | 40 sccm |
| Pressure | 10 Pa |
| Time | 30 seconds |

Furthermore, the surface region 102a was subjected to an acid treatment using buffered hydrofluoric acid ($NH_4F$:HF=10:1) for 30 minutes. Subsequently the surface region 102a was washed using pure water for two minutes.

As shown in FIG. 2G, an aluminum layer having a thickness of 500 nanometers was formed by a vacuum evaporation method on the surface region 102a. On the other hand, a silver layer having a thickness of 400 nanometers was formed by the vacuum evaporation method on the p-type nitride semiconductor layer 104.

Then, the nitride semiconductor stacking structure was subjected to a sinter treatment under a temperature of 500 degrees Celsius for 20 minutes.

Finally, a titanium layer having a thickness of 40 nanometers and a gold layer having a thickness of 750 nanometers were formed by a vacuum evaporation method on the aluminum layer and on the silver layer. In this way, the nitride semiconductor light-emitting element according to the example 1 was obtained.

Example 2

The experiment similar to the example 1 was performed except that the acid treatment using buffered hydrofluoric acid was not performed.

Comparative Example 1

The experiment similar to the example 1 was performed except that the oxygen plasma treatment was not performed.

Comparative Example 2

The experiment similar to the example 1 was performed except that a c-plane GaN substrate was used instead of the m-plane GaN substrate. Needless to say, the p-type nitride semiconductor layer 102, the active layer 103 and the n-type nitride semiconductor layer 104 each have a principal plane of a c-plane in the comparative example 2.

Comparative Example 3

The experiment similar to the example 1 was performed except that a c-plane GaN substrate was used instead of the m-plane GaN substrate and except that the oxygen plasma treatment was not performed. Needless to say, the p-type nitride semiconductor layer 102, the active layer 103 and the n-type nitride semiconductor layer 104 each have a principal plane of a c-plane also in the comparative example 3.

(Measurement of Current-Voltage Properties)

Figure 4A:
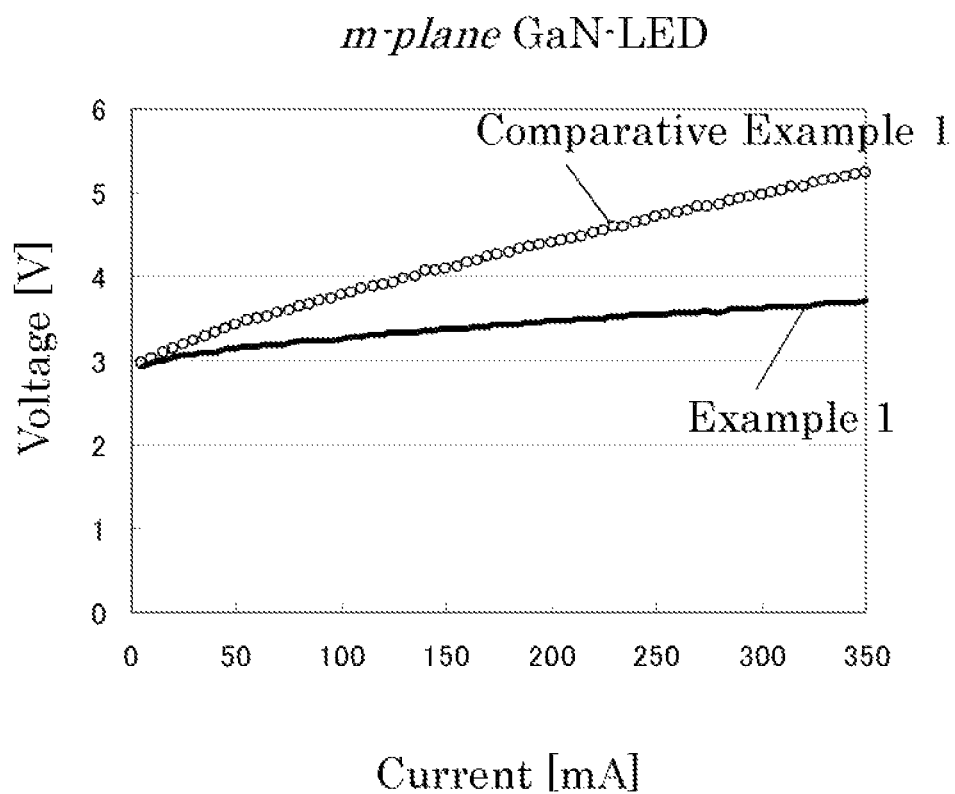
FIG. 4A shows current-voltage properties of the nitride semiconductor light emitting elements according to the example 1 and the comparative example 1.
Figure 4B:
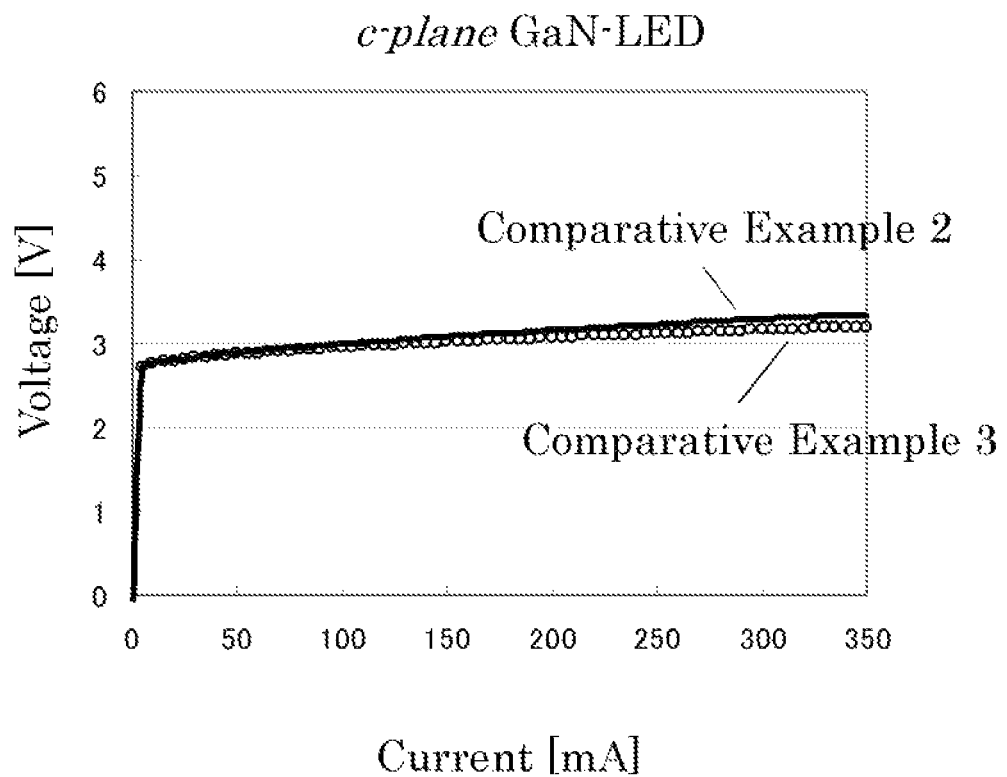
FIG. 4B shows current-voltage properties of the nitride semiconductor light emitting elements according to the comparative example 2 and the comparative example 3.

The current-voltage properties of the nitride semiconductor light-emitting elements according to the example 1 and the comparative examples 1-3 were measured. FIG. 4A shows the current-voltage properties of the nitride semiconductor light-emitting elements according to the example 1 and the comparative example 1. FIG. 4B shows the current-voltage properties of the nitride semiconductor light-emitting elements according to the comparative examples 2-3.

The following Table 4 shows series resistance values between 250 milliamperes and 350 milliamperes which were calculated from the current-voltage properties.

TABLE 4

| Example 1 | 1.66 ohms |
|---|---|
| Comparative example 1 | 5.32 ohms |
| Comparative example 2 | 1.17 ohms |
| Comparative example 3 | 0.83 ohms |

As is clear from FIG. 4A and Table 4, if the surface region 102a has a principal plane of an m-plane and if the surface region 102a which has been subjected to the dry-etching by the halogen plasma treatment is further subjected to the oxygen plasma treatment, the resistance value is lowered. On the other hand, even if the surface region 102a has a principal plane of an m-plane, however, if the surface region 102a is not subjected to the oxygen plasma treatment, the resistance value remains high.

As is clear from FIG. 4B and Table 4, if the surface region 102a has a principal plane of a c-plane, and if the surface region 102a which has been subjected to the dry-etching by the halogen plasma treatment is further subjected to the oxygen plasma treatment, the resistance value is increased. This phenomenon on a c-plane is the exact reverse of the phenomenon of an m-plane. Accordingly, if the surface region 102a has a principal plane of a c-plane, it would be obvious from FIG. 4B that a skilled person would not subject the surface region 102a which has been subjected to the dry-etching by the halogen plasma treatment to an oxygen plasma treatment.

(Secondary Ion Mass Spectrometry)

Figure 9:
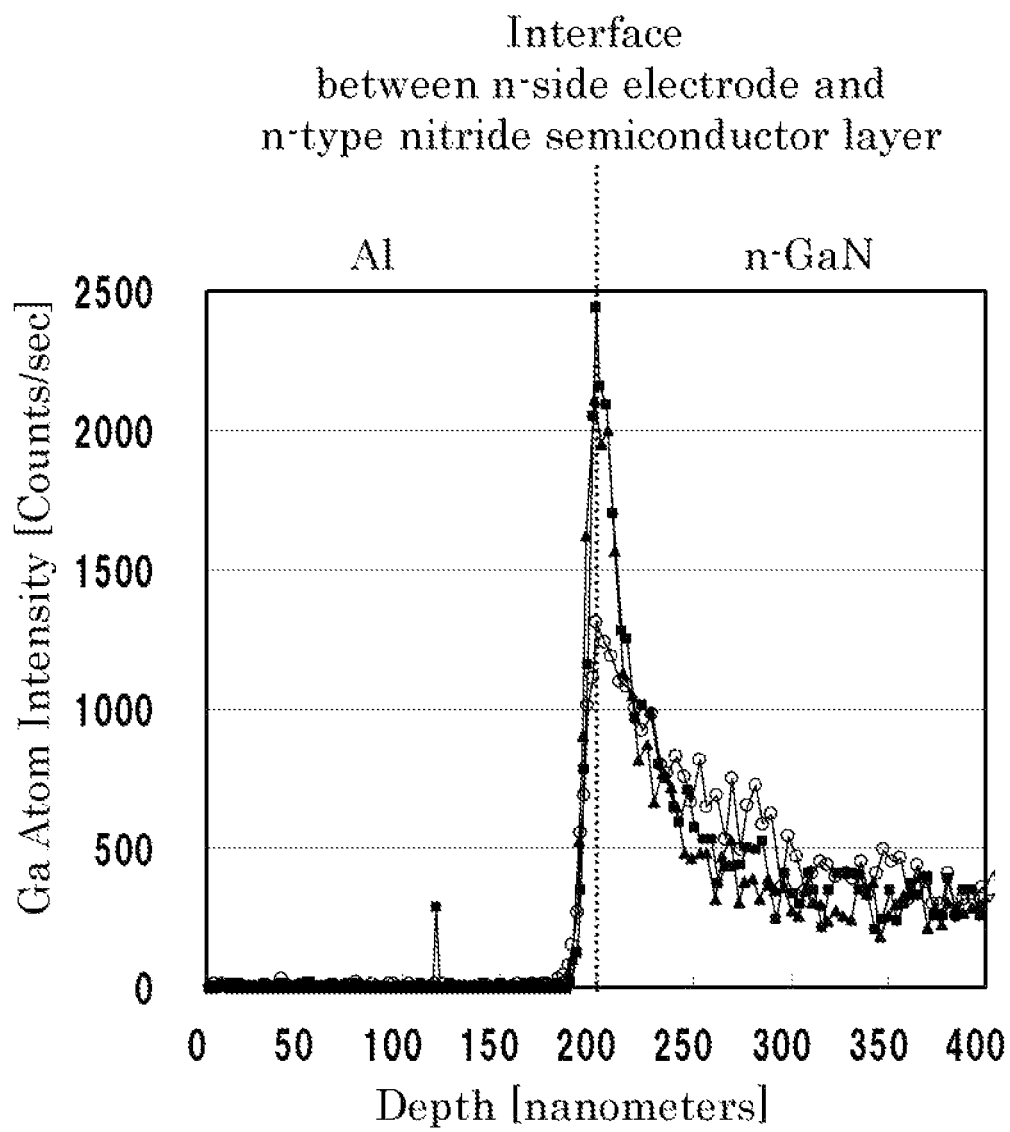
FIG. 9 shows a SIMS profile of the n-side electrode formed of aluminum and the n-type nitride semiconductor layer formed of n-GaN before a sinter treatment is performed.
Figure 10:
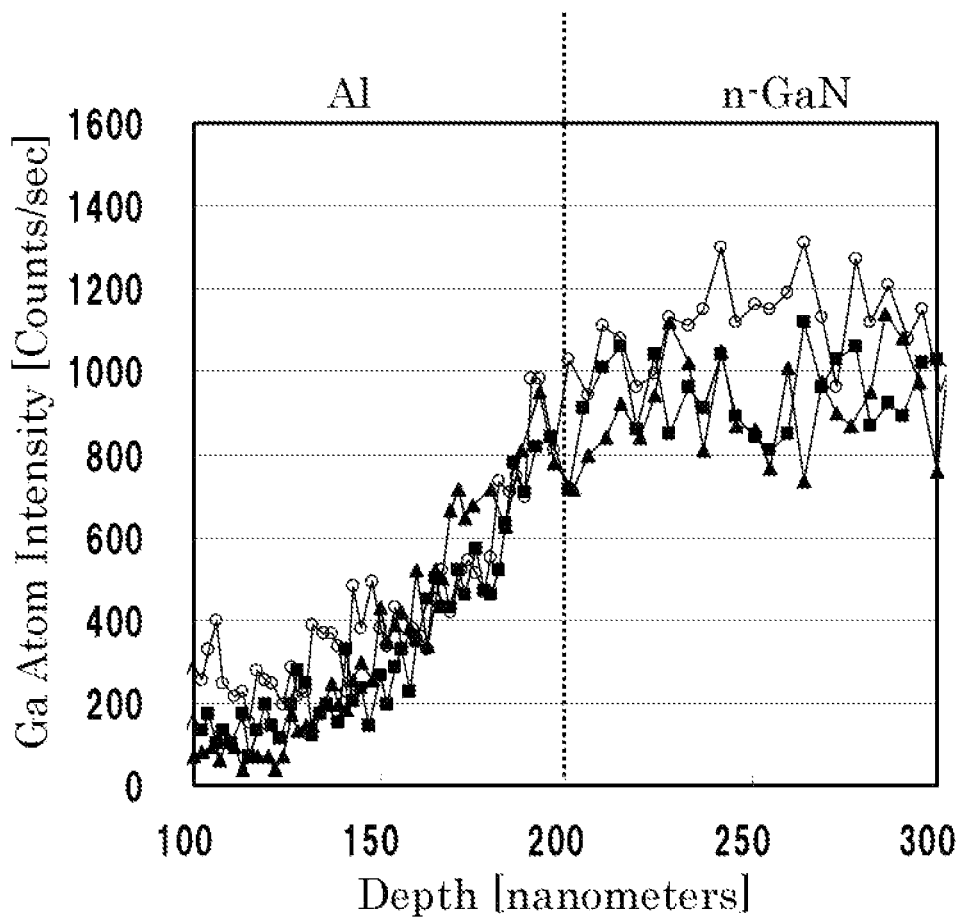
FIG. 10 shows a SIMS profile of the n-side electrode formed of aluminum and the n-type nitride semiconductor layer formed of n-GaN after a sinter treatment is performed.
Figure 11:
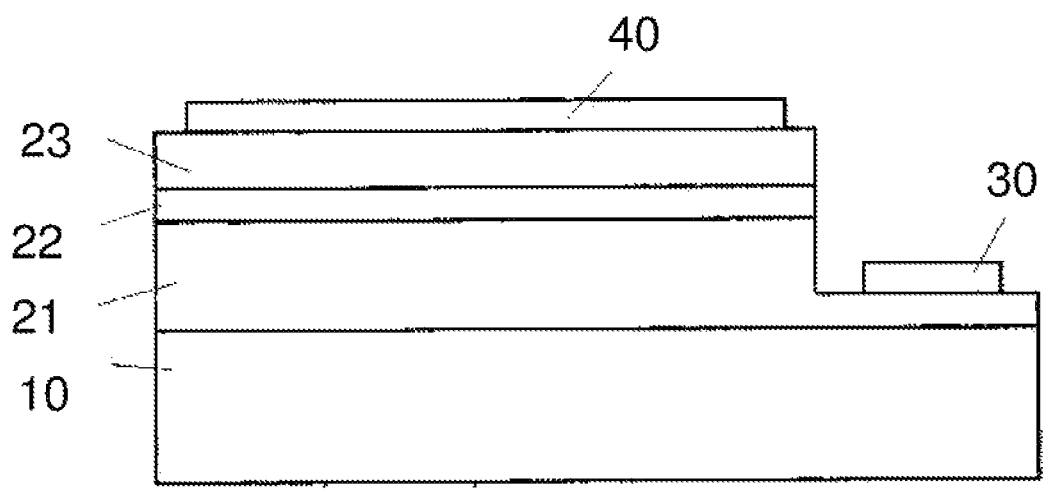
FIG. 11 shows an m-plane nitride semiconductor light emitting element disclosed in US Pre-Grant Patent Application Publication No. 2013/0126902.

The nitride semiconductor light-emitting elements according to the example 1, the example 2 and the comparative example 1 were subjected to a secondary ion mass spectrometry (hereinafter, referred to as "SIMS"). FIG. 9 shows a SIMS profile of the n-side electrode 109 formed of aluminum and the n-type nitride semiconductor layer 102 formed of n-GaN before the sinter treatment is performed. FIG. 10 shows a SIMS profile of the n-side electrode formed of aluminum and the nitride semiconductor layer 102 formed of n-GaN after the sinter treatment is performed.

As is clear from FIG. 9 and FIG. 10, compared to the nitride semiconductor light-emitting element according to the comparative example 1, a greater amount of gallium atoms were diffused from the n-type nitride semiconductor layer 102 to the n-side electrode 109 in the nitride semiconductor light-emitting elements according to the examples 1-2. This suggests that a greater amount of gallium vacancies were formed in the n-type nitride semiconductor layers 102 included in the nitride semiconductor light-emitting elements according to the examples 1-2.

(Measurement of Carrier Concentration)

Reference Example A1

In the reference example A1, an n-type GaN layer having a thickness of 1 micrometer was epitaxially grown under a growth temperature of 945 degrees Celsius on an n-type GaN substrate having a principal plane of an m-plane. The n-type GaN layer had a silicon concentration of $2.0 \times 10^{18}$ cm$^{-3}$.

Then, the n-type GaN layer was subjected to an oxygen plasma treatment under the condition shown in Table 3. Subsequently, the surface of the n-type GaN layer was subjected to an acid treatment using buffered hydrofluoric acid (NH$_4$F: HF=10:1) for 30 minutes. After the acid treatment, the surface of the n-type GaN layer was washed using pure water for two minutes.

Carrier concentrations at the depth of 100 nanometers, 125 nanometers, 150 nanometers, 175 nanometers and 200 nanometers were measured by a capacity-voltage measurement method (hereinafter, referred to as "C-V measurement"). The following non-patent literatures disclose the details of the C-V measurement.

S. M. Sze: Physics of Semiconductor Devices, 2nd ed. (John Wiley, NY, 1981) Chap. 2.5.

J. Hilbrand and R. D. Gold: RCA Rev. 21 (1960) 245

M. G. Buehler: IEEE Trans. Electron Devices ED-19 (1972) 1171

K. H. Zaininger and F. P. Heiman: Solid State Tech. 13 (1970) 46

Reference Example A2

The experiment similar to the reference example A1 was performed except that the n-type GaN layer was not subjected to the acid treatment using buffered hydrofluoric acid.

Reference Comparative Example A1

The experiment similar to the reference example A1 was performed except that the n-type GaN layer was not subjected to the oxygen plasma treatment and except that the n-type GaN layer was not subjected to the acid treatment using buffered hydrofluoric acid.

The following Table 5 shows the carrier concentrations of the n-type nitride semiconductor layers according to the reference example A1, the reference example A2 and the reference comparative example A1. As is clear from Table 5, the oxygen plasma treatment decreases the carrier concentration of the n-type nitride semiconductor layer at a depth of 100-150 nanometers. For this reason, the n-type nitride semiconductor layer which has been subjected to the oxygen plasma treatment, namely, the n-type nitride semiconductor layers according to the reference examples A1-A2, have lower carrier concentration than the n-type nitride semiconductor which has not been subjected to the oxygen plasma treatment, namely, the n-type nitride semiconductor according to the reference comparative example A1.

TABLE 5

| Depth d (nanometer) from the surface of the n-type nitride semiconductor layer | Reference example A1 | Reference example A2 | Reference comparative example A1 |
|---|---|---|---|
| 100 | $1.0 \times 10^{17}$ cm$^{-3}$ | $1.0 \times 10^{17}$ cm$^{-3}$ | $1.6 \times 10^{17}$ cm$^{-3}$ |
| 125 | $1.3 \times 10^{17}$ cm$^{-3}$ | $1.3 \times 10^{17}$ cm$^{-3}$ | $1.6 \times 10^{17}$ cm$^{-3}$ |
| 150 | $1.5 \times 10^{17}$ cm$^{-3}$ | $1.5 \times 10^{17}$ cm$^{-3}$ | $1.6 \times 10^{17}$ cm$^{-3}$ |
| 175 | $1.6 \times 10^{17}$ cm$^{-3}$ | $1.6 \times 10^{17}$ cm$^{-3}$ | $1.6 \times 10^{17}$ cm$^{-3}$ |
| 200 | $1.6 \times 10^{17}$ cm$^{-3}$ | $1.6 \times 10^{17}$ cm$^{-3}$ | $1.6 \times 10^{17}$ cm$^{-3}$ |

As understood from the reference examples A1-A2 and the reference comparative example A1, if the oxygen plasma treatment is performed, the carrier concentration decreases monotonically from the inside of the n-type nitride semiconductor layer toward the surface of the n-type nitride semiconductor layer. On the other hand, if the oxygen plasma treatment is not performed, the carrier concentration is constant along the depth direction.

(Measurement of Current-Voltage Properties)

Reference Example B1

Figure 5A:
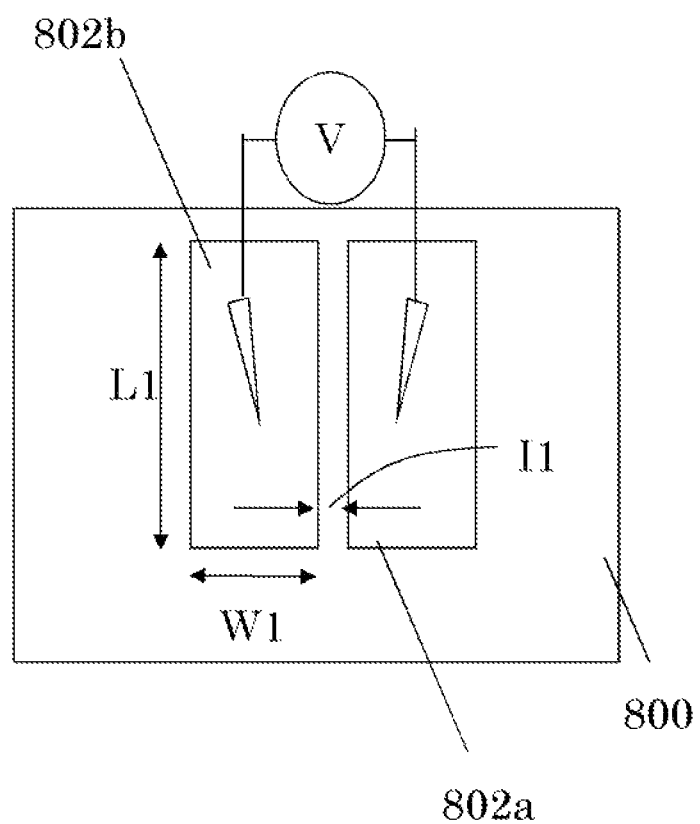
FIG. 5A shows a top view of the reference example B1.
Figure 5B:
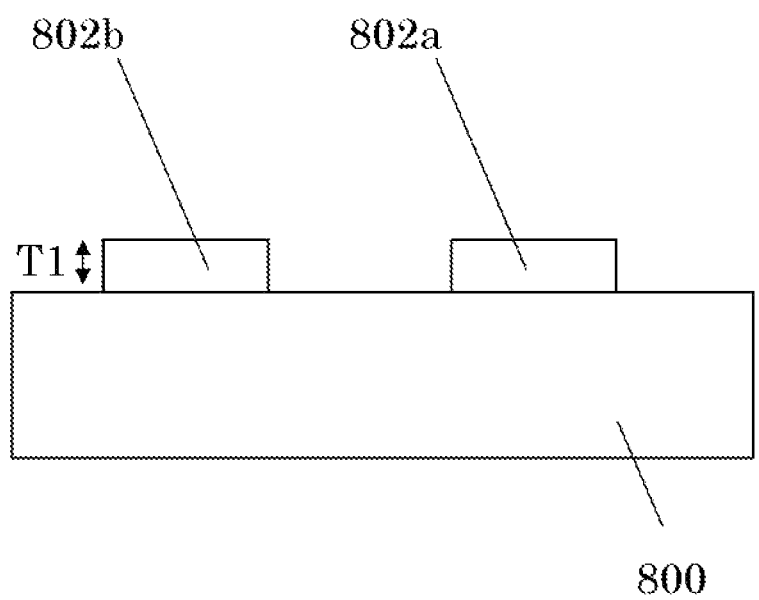
FIG. 5B shows a cross-sectional view of the reference example B1.

FIG. 5A and FIG. 5B show a plan view and a cross-sectional view of the reference example B1, respectively.

In the reference example B1, an n-type GaN layer 800 having a thickness of 1 micrometer was epitaxially grown under a growth temperature of 945 degrees Celsius on an n-type GaN substrate (not shown in FIG. 5A and FIG. 5B) having a principal plane of an m-plane. The n-type GaN layer 800 had a silicon concentration of $2.0 \times 10^{18}$ cm$^{-3}$.

Then, the n-type GaN layer 800 was subjected to an oxygen plasma treatment under the condition shown in Table 3. Subsequently, the surface of the n-type GaN layer 800 was subjected to an acid treatment using buffered hydrofluoric acid (NH$_4$F:HF=10:1) for 30 minutes. After the acid treatment, the surface of the n-type GaN layer 800 was washed using pure water for two minutes. Finally, a first n-side electrode layer 802a and a second n-side electrode layer 802b each formed of aluminum were formed on the n-type GaN layer 800 by a vacuum evaporation method.

As shown in FIG. 5A, the first n-side electrode layer 802a had a width W1 of 100 micrometers. The first n-side electrode layer 802a had a length L1 of 200 micrometers. The interval I1 between the first n-side electrode layer 802a and the second n-side electrode layer 802b was 20 micrometers. As shown in FIG. 5B, the first n-side electrode layer 802a had a thickness T1 of 0.4 micrometers. The second n-side electrode layer 802b had a shape identical to that of the first n-side electrode layer 802a.

As shown in FIG. 5A, the current-voltage properties between the first n-side electrode layer 802a and the second n-side electrode layer 802b were measured.

Reference Example B2

The experiment similar to the reference example B1 was performed except that the n-type GaN layer 800 was not subjected to the acid treatment using the buffered hydrofluoric acid.

Reference Comparative Example B1

The experiment similar to the reference example B1 was performed except that the n-type GaN layer 800 was not subjected to the oxygen plasma treatment and except that the n-type GaN layer 800 was not subjected to the acid treatment using the buffered hydrofluoric acid.

FIG. 6 shows the current-voltage properties according to the reference example B1, the reference example B2 and the reference comparative example B1.

As is clear from FIG. 6, even when the n-type GaN layer 800 was not subjected to the acid treatment using the buffered hydrofluoric acid (see the reference example B2), the resistance was low, similarly to the case where the n-type GaN layer 800 was subjected to the acid treatment using the buffered hydrofluoric acid (see the reference example B1)

On the other hand, when the n-type GaN layer 800 was not subjected to the oxygen plasma treatment (see the reference comparative example B1), the resistance was high.

As understood from FIG. 6, the oxygen plasma treatment lowers the contact resistance between the m-plane nitride semiconductor layer and the electrode layer formed of aluminum.

Reference Comparative Examples B2-B6

The experiments similar to the reference example B1 were performed except that the first n-side electrode layer 802a and the second n-side electrode layer 802b each formed of the materials shown in Table 6 were used instead of those each formed of aluminum. Needless to say, the n-type GaN layer 800 was subjected to the oxygen plasma treatment in the reference comparative examples B2-B6. The current-voltage properties between the first n-side electrode layer 802a and the second n-side electrode layer 802b were measured as shown in FIG. 5A.

TABLE 6

| Reference comparative example B2 | Magnesium |
| Reference comparative example B3 | Silver |
| Reference comparative example B4 | Titanium |
| Reference comparative example B5 | Nickel |
| Reference comparative example B6 | Platinum |

FIG. 7A-FIG. 7E shows the current-voltage properties according to the reference comparative examples B2-B6, respectively.

As understood from FIG. 6 and FIGS. 7A-7E, when the material of the electrode layer was aluminum, the resistance was low. On the other hand, when the material of the electrode layer was material other than aluminum, the resistance was high.

INDUSTRIAL APPLICABILITY

The nitride semiconductor light-emitting element according to the present invention is a nitride semiconductor light-emitting diode or a nitride semiconductor laser. A nitride semiconductor light-emitting diode is desirable. The nitride semiconductor light-emitting diode according to the present invention is installed in a lighting installation. Desirably, the nitride semiconductor light-emitting element according to the present invention is installed in an automotive headlight.

REFERENTIAL SIGNS LIST 101 substrate
102 n-type nitride semiconductor layer
102a surface region
103 active layer
104 p-type nitride semiconductor layer
108 p-side electrode
109 n-side electrode
800 n-type GaN layer
802a first n-side electrode layer
802b second n-side electrode layer
810 normal direction of m-plane
820 normal direction of principal plane
10 substrate
21 n-type nitride semiconductor layer
22 active layer
23 p-side nitride semiconductor layer
30 n-side electrode
40 p-side electrode

The invention claimed is:

1. A method for fabricating a nitride semiconductor light-emitting element, the method comprising steps of:
   (a) growing an n-type nitride semiconductor layer epitaxially on a substrate, wherein the n-type nitride semiconductor layer has a principal plane of an m-plane;
   (b) growing an active layer epitaxially on the n-type nitride semiconductor layer grown in the step (a), wherein the active layer has a principal plane of an m-plane;
   (c) growing a p-type nitride semiconductor layer epitaxially on the active layer grown in the step (b) to obtain a nitride semiconductor stacking structure, wherein the p-type nitride semiconductor layer has a principal plane of an m-plane;
   (d) removing a portion of the p-type nitride semiconductor layer, a portion of the active layer and a portion of the n-type nitride semiconductor layer by a plasma etching process using a gas containing halogen to the extent to form a plasma-etched surface region exposed on the n-type nitride semiconductor layer;
   (e) subjecting the plasma-etched surface region exposed in the step (d) to a plasma treatment using a gas containing oxygen;
   (e1) subjecting the surface region subjected to the plasma treatment using the gas containing oxygen in the step (e) to an acid treatment; and
   (f) forming an n-side electrode formed of aluminum on the plasma-etched surface region which has been subjected to the plasma treatment using the gas containing oxygen in the step (e) and the acid treatment in the step (e1), and forming a p-side electrode electrically connected to the p-type nitride semiconductor layer, wherein:

the n-side electrode is in contact with the plasma-etched surface region.

2. The method according to claim 1, wherein buffered hydrofluoric acid is used in the acid treatment.

3. The method according to claim 1, wherein the n-side electrode consists only of aluminum in the step (f).

4. The method according to claim 1, wherein the n-side electrode has a shape of a layer parallel to the n-type nitride semiconductor layer in the step (f).

5. The method according to claim 1, further comprising the following step (g) after the step (t):
   (g) subjecting the nitride semiconductor stacking structure to a sinter treatment under a temperature of not less than 400 degrees Celsius and not more than 600 degrees Celsius to diffuse gallium atoms contained in the n-type nitride semiconductor layer into the n-side electrode.

6. The method according to claim 1, wherein after the step (f), the surface region has a carrier concentration which decreases from the inside of the n-type nitride semiconductor layer toward the n-side electrode.

7. The method according to claim 6, wherein a portion of the surface region where the carrier concentration decreases from the inside of the n-type nitride semiconductor layer toward the n-side electrode has a thickness of not less than 10 nanometers and not more than 150 nanometers.

8. A method for forming a nitride semiconductor structure comprising an n-type nitride semiconductor layer and a metal layer which is formed on the n-type nitride semiconductor layer, the method comprising the following steps (d) to (f):
   (d) subjecting a surface of the n-type nitride semiconductor layer to a plasma treatment using a gas containing halogen; wherein the n-type nitride semiconductor layer has a principal plane of an m-plane,
   (e) subjecting the surface of the n-type nitride semiconductor layer to a plasma treatment using a gas containing oxygen after the step (d);
   (e1) subjecting the surface of the n-type nitride semiconductor layer subjected to the plasma treatment using the gas containing oxygen in the step (e) to an acid treatment; and
   (f) forming the metal layer formed of aluminum on the surface of the n-type nitride semiconductor layer subjected to the plasma treatment using the gas containing oxygen in the step (e) and the acid treatment in the step (e1) to obtain the nitride semiconductor structure, wherein:
   the metal layer is in contact with the surface of the n-type nitride semiconductor layer.

9. The method according to claim 8, wherein buffered hydrofluoric acid is used in the acid treatment.

10. The method according to claim 8, wherein the metal layer consists only of aluminum in the step (f).

11. The method according to claim 8, wherein the metal layer has a shape of a layer parallel to the n-type nitride semiconductor layer in the step (f).

12. The method according to claim 8, further comprising the following step (g) after the step (f):
    (g) subjecting the nitride semiconductor structure to a sinter treatment under a temperature of not less than 400 degrees Celsius and not more than 600 degrees Celsius to diffuse gallium atoms contained in the n-type nitride semiconductor layer into the metal layer.

13. The method according to claim 8, wherein after the step (f), the surface of the n-type nitride semiconductor layer has a carrier concentration which decreases from the inside of the n-type nitride semiconductor layer toward the metal layer.

14. The method according to claim 13, wherein a portion of the surface of the n-type nitride semiconductor layer where the carrier concentration decreases from the inside of the n-type nitride semiconductor layer toward the metal layer has a thickness of not less than 10 nanometers and not more than 150 nanometers.

\* \* \* \* \*